(12) United States Patent
Tan et al.

(10) Patent No.: US 11,445,614 B2
(45) Date of Patent: Sep. 13, 2022

(54) SYSTEM FOR FASTENING MULTIPLE STACKED PLANAR OBJECTS WITH ADAPTIVE COMPENSATORY MECHANISM

(71) Applicants: JLK Technology Pte Ltd, Singapore (SG); JLK Automation (Dongguan) Co. Ltd, Dongguan (CN)

(72) Inventors: Sia Nguan Eugene Tan, Singapore (SG); Song Tao Li, Dongguan (CN)

(73) Assignees: JLK Technology Pte Ltd, Singapore (SG); JLK Automation (Dongguan) Co. Ltd, Dongguan (CN)

( * ) Notice: Subject to any disclaimer, the term of this patent is extended or adjusted under 35 U.S.C. 154(b) by 654 days.

(21) Appl. No.: 16/393,772

(22) Filed: Apr. 24, 2019

(65) Prior Publication Data

US 2020/0344887 A1    Oct. 29, 2020

(51) Int. Cl.
| | |
|---|---|
| *H05K 3/00* | (2006.01) |
| *B23P 19/04* | (2006.01) |
| *H05K 13/08* | (2006.01) |
| *H05K 13/04* | (2006.01) |

(52) U.S. Cl.
CPC ............ *H05K 3/005* (2013.01); *B23P 19/04* (2013.01); *H05K 13/04* (2013.01); *H05K 13/0895* (2018.08); *H05K 2201/041* (2013.01); *H05K 2203/02* (2013.01)

(58) Field of Classification Search
CPC . B23P 19/02; B23P 19/04; F16B 5/04; H05K 13/04; H05K 13/0895; H05K 2201/041; H05K 2203/02; H05K 3/005
See application file for complete search history.

(56) References Cited

U.S. PATENT DOCUMENTS

| | | | |
|---|---|---|---|
| 6,851,182 B2* | 2/2005 | Okada | A41H 37/10 |
| | | | 29/798 |
| 8,136,235 B2* | 3/2012 | Woods | B23P 19/062 |
| | | | 29/818 |
| 2020/0344887 A1* | 10/2020 | Tan | H05K 3/005 |
| 2020/0357601 A1* | 11/2020 | Enomoto | F16F 7/015 |

* cited by examiner

*Primary Examiner* — Minh N Trinh
(74) *Attorney, Agent, or Firm* — Sinorica LLC

(57) ABSTRACT

The disclosed system generally comprises a damping module, a pressing module, a placement platform for placement of the multiple stacked planar objects and a compensatory mechanism engaging to the damping module. Particularly, the damping module includes a damper, a resilient component and an elongate support which are all arranged within a holder. Each of the stacked planar objects has a top planar surface and an underside planar surface as well as carries a plurality of corresponding holes, which become aligned accordingly to form a plurality of longitudinal grooves upon placement onto the platform. The head portion of the damper is substantially aligning with the positioned groove and abutting onto the underside surface of the bottommost stacked object. The compensatory mechanism is capable of adaptively adjusting position of the head portion of the damper in relation to the pressing ram at the vertical and/or horizontal plane.

11 Claims, 11 Drawing Sheets

SYSTEM FOR FASTENING MULTIPLE STACKED PLANAR OBJECTS WITH ADAPTIVE COMPENSATORY MECHANISM

TECHNICAL FIELD

The present disclosure relates to a system for joining or fastening multiple stacked planar objects possessing substantial mechanical strength. The disclosed system is incorporated with multiple modules to effectuate the joining of the planar objects and a compensatory mechanism to provide correction against wearing of one or more modules after prolong operation of the disclosed system. The disclosed system also includes a method of managing wearing of one or more modules in the disclosed system or the like.

BACKGROUND

With the ever-increasing demand to produce thinner and lighter consumer electronic devices such as smartphone and laptop, the process to assemble multiple electrical components to produce these electronic devices has become difficult or almost impossible to be carried out even by trained human operator. Various automation robotic systems have hence been developed to perform the tasks to piece together the electronic components with great precision and consistency. One aspect of constructing the electronic devices is to physically fasten or join the pieces together using one or more fastening means like pins or screws. U.S. Pat. No. 5,206,985 discloses an automatic pin inserting apparatus for frame-shaped workpiece with pin-hole of extraordinarily small. Particularly, the apparatus described in this United States patent utilizes image signal captured by a CCD camera about the pin-hole to calculate whether the hole falls within the tolerance of the pin to be inserted. Another assembly system involves pin insertion is described in U.S. Pat. No. 6,058,598 that the system employs a monitoring system using optical sensor and light source to avoid misalignment of the part or component. The monitoring system in this patent can be established separately from the assembly system to attain the desired outcome. Another patent associated to pin feeding and insertion is Chinese patent no. 103369855, which details a system with respect to shortened pin taking time though the pins in this particular system are placed on a mold for forming the device through injection molding. The abovementioned system may have delivered the desired outcome for pin insertion or arrangement as setting out in their respective object but likely to fail in working on substantially fragile components such as thin plastic or metal sheets. More importantly, these thin pieces are generally used to form chassis of the electronic devices that the planar surfaces of these pieces can be irregular in thickness or flatness for functional and aesthetic reasons. Particularly, point-to-point support may have to be provided by the pin inserting or fastening machines in order to free the thin pieces from being damaged by the punching force applied on them in the process of inserting the pin. For instance, the point support is established right underneath of the pin holes on the pieces. The position-based point support can serve as a medium to cushion or absorb the punching force. Under certain situations, the support may in fact reinforce the mechanical resistance of the pieces against the punching force. Moreover, the point supports tend to become worn or torn after being subjected to repetitive compression force from the pressing module. There is a need to closely monitor wearing condition of the point support thus adjustment or correction can be timely conducted.

SUMMARY

The present disclosure aims to provide a system for fastening or joining multiple planar objects such as, but not limited to, alloy sheets, metal sheets, plastic sheets or any combination thereof. The disclosed system comprises multiple operational modules to carry out the fastening or joining processes.

Further object of the present disclosure is directed to a system for fastening or joining multiple planar objects incorporated with an adjustable support or damping module to prevent deformation of the planar objects associated to the joining processes. Generally, at least of the planar objects used in the present disclosure possess substantial mechanical strength that fastening these objects using fastening means like tack pin, panel pin, etc. requires good support to avoid deformation and bending of the panel objects due to punching force of a pressing ram or ram for inserting the fastening means.

Another object of the present disclosure relates to a compensatory mechanism built to the disclosed system to adjust the damping or support module according to the wearing condition of a damper head disposed on the module and/or the surface being supported by the damper head.

Still, another object of the present disclosure is to offer a method can be used in conjunction with the disclosed system and the like to adjustably change the position of a damper head supporting the planar objects by way of monitoring the wearing condition and/or flatness of the supported surface of the planar objects.

At least one of the preceding objects is met, in whole or in part, by the present disclosure, in which one of the embodiments of the present disclosure is a system for joining multiple stacked planar objects. The disclosed system generally comprises an damping module comprising a damper, a resilient component and an elongate support arranged within a holder with the resilient component interposing in between the damper and the support, the damper including a head portion protruding out from an opening of the holder; a pressing module incorporated with a pressing ram which is substantially hanging on top of the head portion of the damper with a distance spanned between the pressing ram and the damper, the pressing ram having a tip to hold a tack pin and being displaceable at the vertical axis towards the head portion of the avail; a platform for placement of the multiple stacked planar objects that each of the stacked planar objects has a top planar surface and an underside planar surface while carrying a plurality of corresponding holes which become aligned accordingly to form a plurality of longitudinal grooves upon placement onto the platform, the platform is configured to position one of the grooves of the stacked planar objects under the pressing ram such that the held tack pin is insertable into the positioned groove for fastening the stacked planar objects thereby for each pressing cycle; and a compensatory mechanism engaging to the damping module. It is important to note that the head portion of the damper is substantially aligning with the positioned groove and abutting onto the underside surface of the bottommost stacked object during the joining process. Thus, the damper and the resilient component are subjected to a compression force for each pressing cycle upon insertion of the tack pin into the positioned groove by the displaced pressing ram while the compensatory mechanism is capable of adaptively adjusting position of the head portion of the damper in relation to the pressing ram at the vertical and/or horizontal plane to potentially tackle wearing of the damper and the resilient component.

For a number of embodiments, the compensatory mechanism adjusts the distance spanned between the head portion of the damper and the tip of the pressing ram corresponding to the wearing status of the damper after subjecting the damper to multiple pressing cycles. As such, sufficient support will be still provided to the stacked objects to work against the punching or compression force in association to the pin insertion.

For more embodiments, the compensatory mechanism comprises a construct on which the damping module is mounted, a first cam being fabricated with a track profile, and a first follower engaged to the construct being secured into the track profile and slidable along the track profile of the first cam corresponding to a rotational movement of the first cam at an axis parallel to the planar surfaces that the first follower sliding on the track profile moves the construct as well as the damping module along the vertical axis thus adjusting the distance spaced between the head portion of the damper and the tip of the pressing ram.

For a couple of embodiments, the compensatory mechanism displaces the damper at the horizontal plane when the top of the head portion lands onto an irregular part of the underside surface of the bottommost planar object to avoid formation of any gap in between the top of the head portion and the underside surface. The formation of gap can be detected using any image or light sensor technology known in the field though modifications may have to be made in relation to the manner which the signal acquired from the sensor is being analysed. One or more sensors may be established around the point support catered by the damper head contacting the underneath surface of the bottommost piece of the stacked planar objects.

According to some embodiments, the compensatory mechanism comprises a construct on which the damping module is mounted on, the construct being based on a moveable stage, a second cam fabricated with a groove profile in which the second follower is located and connecting to the moveable stage, the second cam being slidable lengthwise that the edges of the groove profile displace the second follower and the moveable stage connected to the second follower at the horizontal plane corresponding to a sliding movement of the second cam. Preferably, the second cam is driven by a linear actuator such as pneumatic cylinder, hydraulic pump or linear motor.

According to more embodiments, the damper is defined by, but not limited to, a base retained within the holder, a body extending away from the base and gradually converging or tapering into the head portion with the head portion carrying the substantially flat top.

For more embodiments the resilient component adopts a column-like structure with a substantially flat top and flat bottom respectively contacting to the damper and the support that a through bore is extending from the top towards bottom of the column-like member, the resilient component is being configured to absorb portion of the compression force with the through bore providing sufficient room for the resilient component to temporarily deform.

In several embodiments, the damper and the resilient component are made of elastic material of respectively different material characteristics. The differences in material characteristics, for example Young's modulus value, allow the damper and resilient components to be degraded or deformed at varied rate throughout their service life hence providing better absorption against the compression force.

In accordance with a number of embodiments, the system further comprises a microcontroller being configured to monitor wearing status of the damper by way of counting the number of pressing cycles and drive the rotational movement of the first cam according to the monitored wearing status. the microcontroller matches the counted number of pressing cycles to a plurality of references data stored in a database that each reference data associates to a predetermined distance adjustment required for the damper head upon reaching a predetermined number of pressing cycle, and the microcontroller adjusts the distance spaced between the head portion of the damper and the tip of the pressing ram according to the predetermined distance adjustment.

Another aspect of the present disclosure method of managing wearing of an damping module in a system for joining multiple stacked planar objects comprising the steps of providing the system with a damping module, which comprises a damper and a resilient component arranged within a holder with the resilient component located immediately under the damper, the damper including a head portion protruding out from an opening of the holder to abut onto the underside surface of the bottommost stacked object, the damping module being displaceable along the vertical axis; providing the system with a pressing module which comprises a pressing ram, the pressing ram being spaced apart from the damping module at a distance and vertically displaceable to insert a held tack pin into a groove of the multiple stacked planar objects aligned thereby travelling along the distance for fastening the stacked planar objects in each pressing cycle. The displaced pressing ram subjects the damper and the resilient component to a compression force exerted in each pressing cycle that the compression force wears the damper and/or the resilient component after a predetermined number of pressing cycles.

Like mentioned earlier, the disclosed method also involves counting the number of pressing cycles to determine a wearing status of the damper and/or the resilient component. The counting of the number of pressing cycles in some embodiments may be performed through a microcontroller matching the counted number of pressing cycles to a plurality of reference data stored in a database that each reference data associates to a predetermined distance adjustment required for the head portion of the damper upon reaching a predetermined number of pressing cycles; and adjusting the distance spaced between the head portion of the damper and the pressing ram according to the predetermined distance adjustment to compensate wearing of the damper and/or the resilient component by displacing the damping module along the vertical axis.

For further embodiments of the disclosed method, the adjusting step is carried out by a compensatory mechanism comprising a construct on which the damping module is mounted, a disc cam fabricated with a track profile and a first follower engaged to the construct being secured into the track profile and slidable along the track profile of the disc cam corresponding to a rotational movement of the disc cam at an axis parallel to the planar surfaces that the first follower sliding on the track profile moves the construct as well as the damping module along the vertical axis thus adjusting the distance spaced between the head portion of the damper and the tip of the pressing ram.

With respect to some other embodiments, the method preferably has the damper and the resilient component made of elastic material of respectively different material characteristics, for example Young modulus value, to yield better effect in absorbing and/or resistant against the compression force exposed.

Furthermore, the reference data are sorted according to combined material characteristics such as Young's Modulus value of the damper and resilient component in some embodiments of the disclosed method.

DETAILED DESCRIPTION

Figure 1:
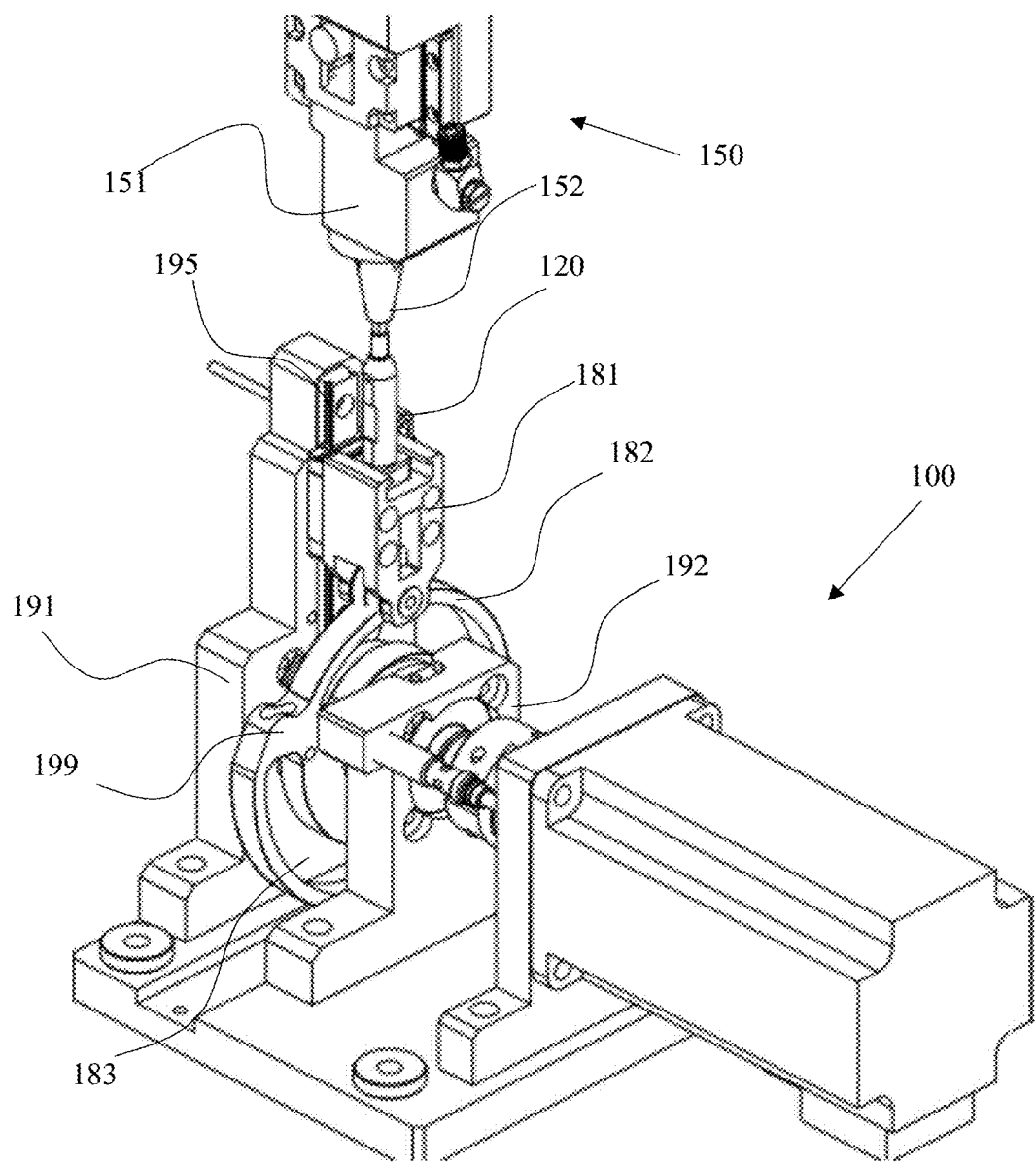
FIG. 1 illustrates one embodiment of the engaged damping module, the pressing module and the compensatory mechanism without the placement platform.

Hereinafter, the disclosure shall be described according to the preferred embodiments and by referring to the accompanying description and drawings. However, it is to be understood that referring the description to the preferred embodiments of the invention and to the drawings is merely to facilitate discussion of the various disclosed embodiments and it is envisioned that those skilled in the art may devise various modifications without departing from the scope of the appended claim.

As used herein, the phrase "in embodiments" means in some embodiments but not necessarily in all embodiments.

As used herein, the phrase "material characteristic" refers to a value computed through one or more equations using readings collected about properties of the damping module and resilient material based upon Young's Modulus, Stress-Strain Cycle and Cyclic Fatigue Tests.

As used herein, the terms "approximately" or "about", in the context of concentrations of components, conditions, other measurement values, etc., means +/−5% of the stated value, or +/−4% of the stated value, or +/−3% of the stated value, or +/−2% of the stated value, or +/−1% of the stated value, or +/−0.5% of the stated value, or +/−0% of the stated value.

The term "damper" used herein throughout the specification refers to a support dedicated generally backing the stacked planar objects 300 at a point or location adjacent to a groove, formed by a plurality of aligned pin holes or bores of the stacked planar objects, at which the pin is inserted by a pressing ram or ram under a compression force produced by a load cell. The damper and a resilient component located under the damper are repetitively subjected to the compression force of the load cell for each pin insertion cycle. The damper and the resilient component may absorb portion of the compression force to prevent deformation of the planar objects. The term "damper head" and "head portion of the damper" referring a part of the damper protruding out of the holder may be used interchangeably in this specification unless mentioned otherwise.

Referring to FIG. 1-7, few embodiments of the present disclosure relating to a system 100 for joining multiple stacked planar objects 300 are illustrated. Preferably, the system 100 comprises a damping module 120, a pressing module 150, a placement platform 170 and a compensatory mechanism engaged to the damping module and the placement platform 170.

Figure 2:
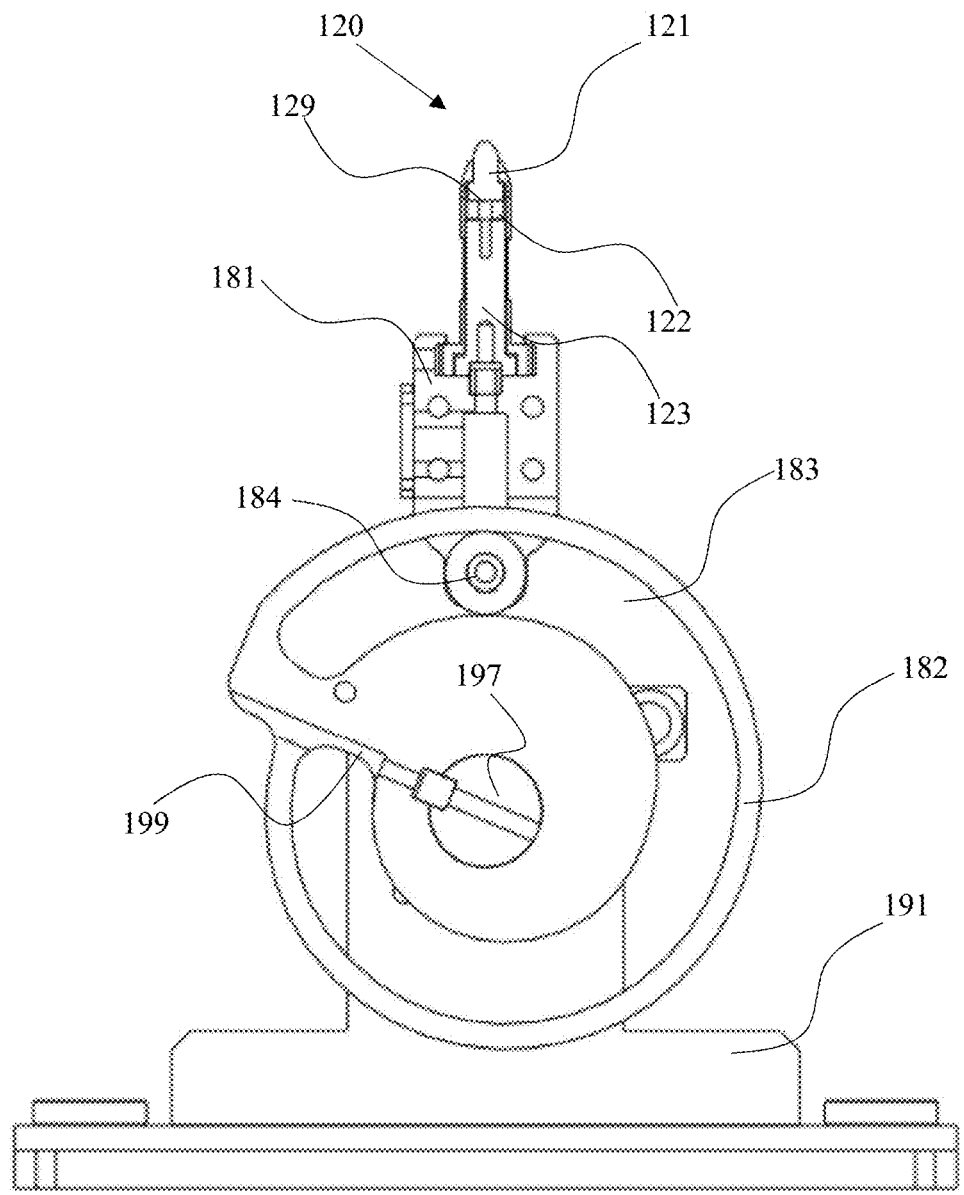
FIG. 2 illustrates further part of the compensatory mechanism involving the first cam and first follower coupled to the first cam to effectuate the displacement of the damping module at the vertical axis (Y-axis)
Figure 3:
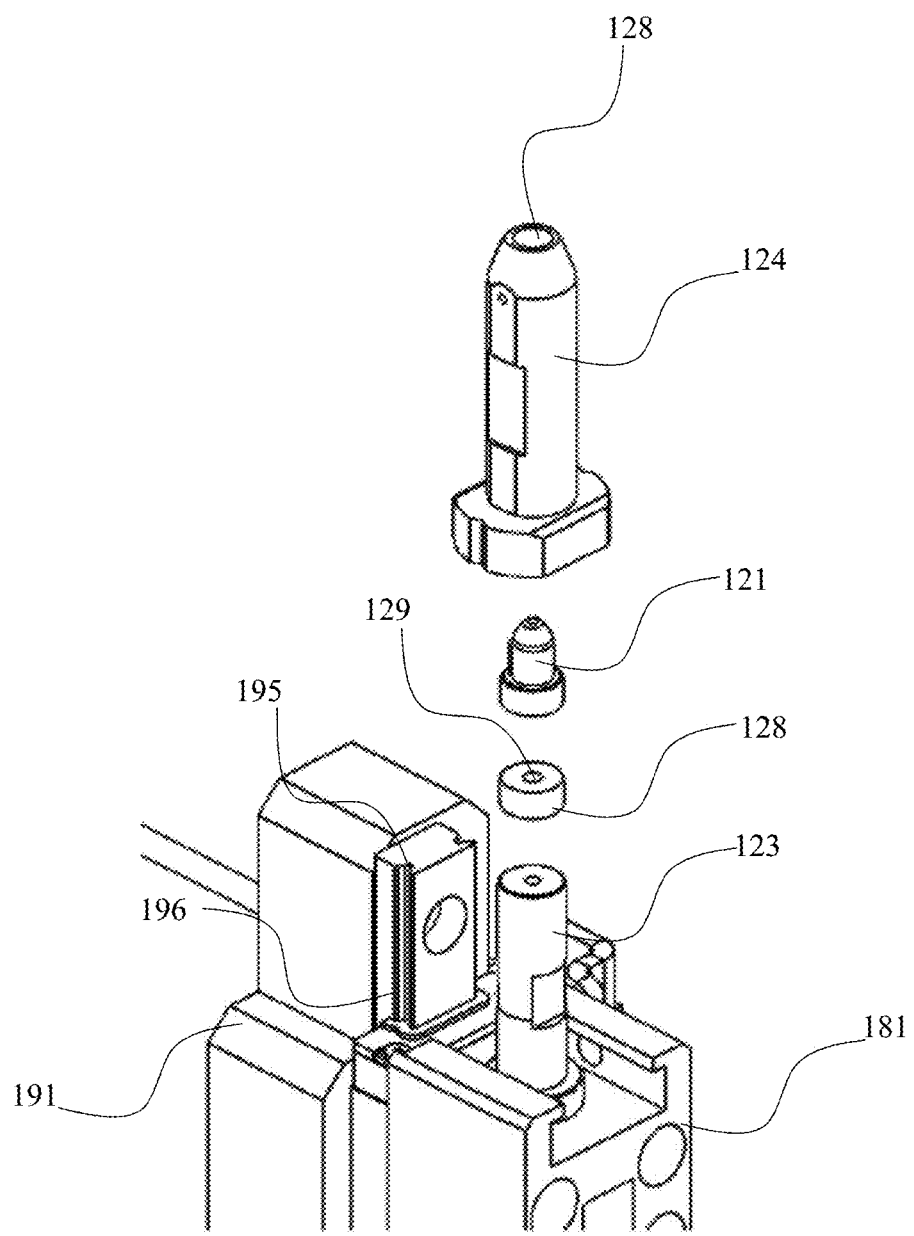
FIG. 3 shows the second cam and second cam follower used in one embodiments of the present disclosure to carry out the FIG. 4 is an explosive view of the damping module detailing the damper, the resilient component, and the support kept within the holder.

In more specific, the damping module 120 for several embodiments includes a damper 121 and a resilient component 122 arranged within a holder 124. The resilient component is adjacent to, preferably located immediately below, the damper 121 along their longitudinal axis to at least partially absorb and dissipate a compression force applied to the multiple planar objects 300 to be joined by the disclosed system 100. Optionally, an elongate support 123 may be further arranged within a holder 124 with the resilient component 122 interposing in between the damper 121 and the support 123 for such embodiments. For more embodiments, the holder 124 is substantially a hollow tube having a top opening 128 and a bottom opening respectively at its two ends that the top opening 128 has a diameter relatively smaller than the hollow space enclosed within the holder 124 and/or the diameter of the bottom opening. Meanwhile, the damper 121, the resilient component 122 and the elongate support 123 are sized to have general diameter similar to or slightly smaller the diameter of the hollow space inside the holder 124 such that these parts can be fitted into the holder 124 without being compressed by the sidewall of the holder 124. Preferably the holder 124 is constructed using alloy or metal with excellent mechanical strength allowing the holder 124 to sustain against the repetitive compression force of the pressing module 150 without breakage or deformation. In more embodiments, the damper 121 can be defined by a base 127 retained within the holder 124, a body extending away from the base 127 and gradually converging or tapering into a head portion 126 with the head portion 126 carrying the substantially flat top to offer point support to the stacked planar objects 300. The base 127 of the damper 121 is essentially in a diameter greater than the top opening 128 of the holder 124 to securely anchor the damper 121 to the holder 124. On the other hand, the head portion 126 of the damper 121 or the damper head 126 inherits a diameter smaller than the top opening 128 of the holder 124 that the head portion 126 protrudes out from the top opening 128 to abut onto the underside surface of the bottommost stacked planar object during the process of fastening the planar objects 300 together. For several embodiments, the portion of the holder 124 around the top opening 128 may be shaped to tapered too as shown in FIGS. 2 and 3 conforming to the external appearance of damper head 126.

It is important to note the resilient component 122 in the present disclosure is not a spring or the like. In fact, the resilient component 122 in the present disclosure is fabricated from a resilient material such as rubber or polymers preferably adopting a doughnut-like or column-like configuration (not shown). Particularly, the column-like resilient component 122 has a substantially flat top and flat bottom that the top of the resilient component 122 is placed adjacent to the underside of the base 127 of the damper 121. For embodiments including the elongate support 123, the bottom of the resilient component 122 is rested upon the top of the elongate support 123. According to more embodiments, a through bore 129 is extending from the top towards bottom of the column-like resilient component 122. The diameter ratio of the through bore 129 and the resilient component 122 are varied depending upon the embodiments but preferably within the range of 0.5-5:8-20. As mentioned in earlier description, one major function of the damper 121 and resilient component 122 in the present disclosure is to at least absorb and dissipate portion of the compression force applied against the planar objects 300 in association with the pin insertion. The flexible nature inherited in the resilient component 122 together with the created through bore 129 enables the resilient component 122 to be temporarily deformed without suffering any substantial physical damage when significant compression force is received through the damper 121. The temporary deformation causes part of the energy from the applied compression force to be absorbed and kept in the deformed resilient component 122. Once the compression force has been withdrawn, the resilient component 122 resumes its original configuration concurrently dissipating the stored energy. The through bore 129 gives room for the resilient component 122 to deform or stretch across without significantly squashing against the sidewall of the holder 124 that may result in cracking of the resilient component 122. The length of the resilient component 122 is preferably within the range of 3-10 mm. The length ratio of the resilient component 122 in relation to the damper 121 is 2-8:5-20 to yield the desired damping against the compression force. Some embodiments of the disclosed system 100 may carry the elongate support 123, which is disposed under the resilient component 122 within the holder 124. The elongate support 123 is preferably built from material of low inertia such as ABS, steel, aluminium, ceramics or any combinations derived thereof rendering the compression force to be effectively damped by the damper 121 and the resilient component 122. For a number of embodiments, the damper head 126 becomes fully drawn into the holder 124 upon engaging with the compression force and deformation of the resilient component 122.

More importantly, it was found by the inventors of the present disclosure that the damping against compression force becomes better when the damper 121 and the resilient component 122 are made of elastic material of respectively different material characteristics including Young's Modulus value. For instance, the damper 121 can be fabricated from material with Young's Modulus value of 0.05 GPa to 10 Gpa. The material usable for forming the damper 121 can be, but not limited to, rubber, low density polyethylene, Teflon, high density polyethylene, polypropylene, polycarbonate, polyethylene terephthalate, nylon, polystyrene, fibreboard or any combination derived thereof. Likewise, the resilient component 122 may be prepared from a material with Young's modulus value of 0.05 GPa to 10 Gpa. The material applicable in the making of the resilient component 122 can be rubber, low density polyethylene, Teflon, high density polyethylene, polypropylene, polycarbonate, polyethylene terephthalate, nylon, polystyrene, fibreboard or any combination derived thereof.

Figure 4:
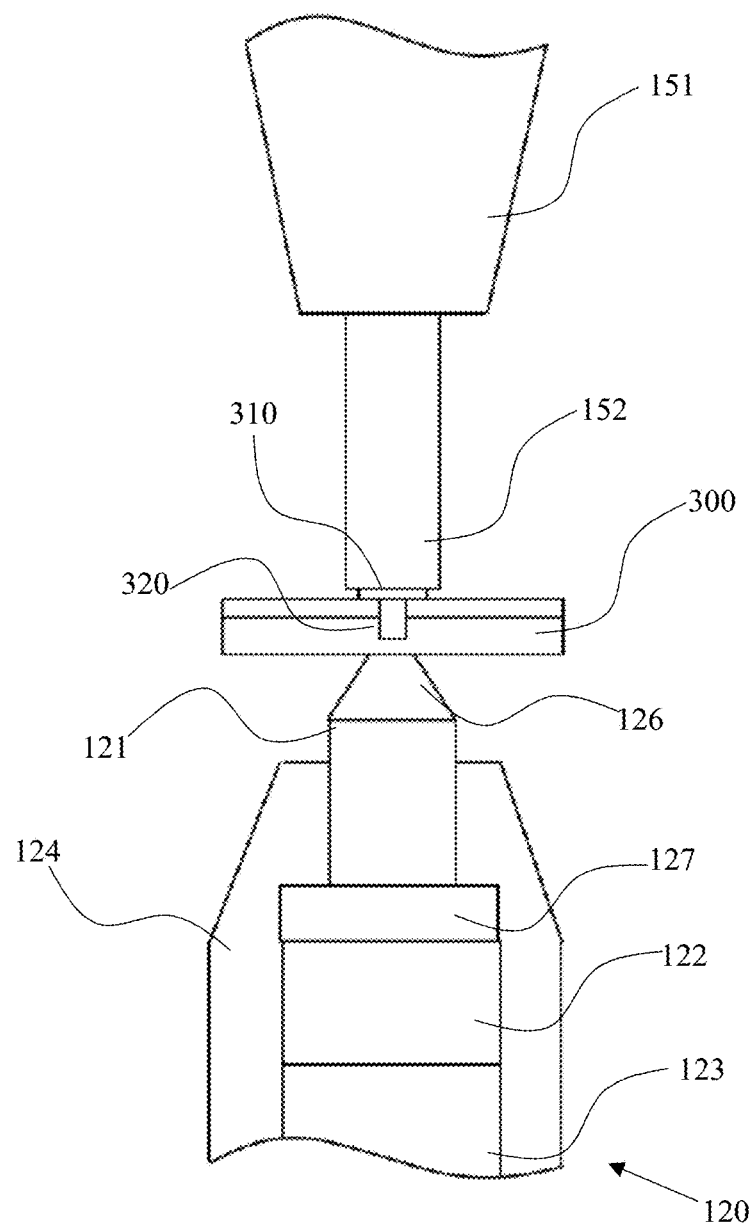
Figure 5:
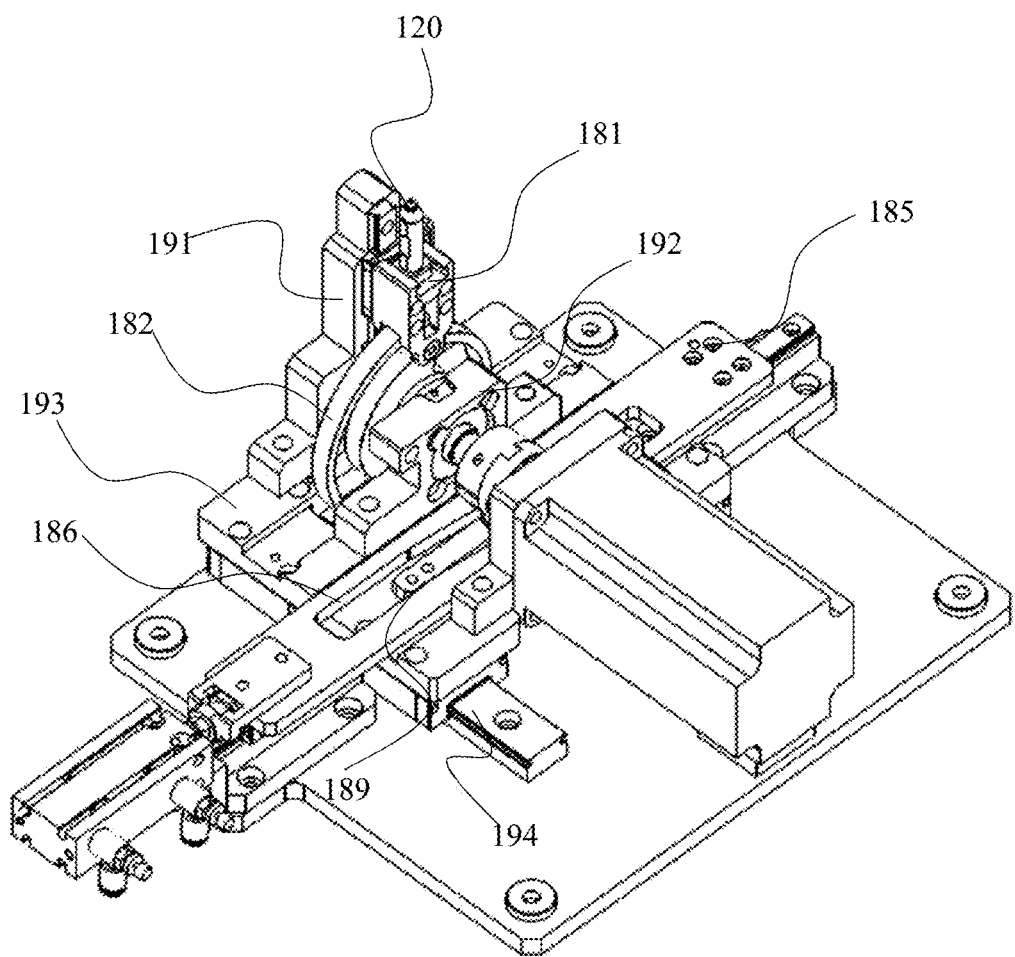
FIG. 5 is a partly cross-sectional view of one embodiment of the disclosed system showing engagement of the press ram and the damping module in relation to the multiple stacked planar objects with a pin being inserted into the groove.

With reference to FIGS. 1 and 4, embodiments of the pressing module 150 incorporated into the disclosed system 100 have been illustrated. In more specific, the pressing module 150 has a pressing ram 151 which is substantially hanging on top of the head portion 126 of the damper 121 with a distance spanned between the pressing ram 151 and the damper 121. The planar objects 300 to be joined or fastened are perpendicularly placed in between the pressing ram 151 and the damper 121 in relation to the longitudinal axis of the pressing ram 151. Further, the pressing ram 151 has a tip 152 to pick then hold a tack pin 310 or the like for fastening the stacked planar objects 300 together. The pressing ram 151 is mechanically connecting to an actuator which drives the movement of the pressing ram 151 around the vertical axis. Specifically, the pressing ram 151 is displaceable by the actuator at the vertical axis towards the head portion 126 of the avail in these embodiments that the damper 121 and the resilient component 122 are subjected to a compression force from the displaced pressing ram 151 for each pressing cycle upon insertion of the tack pin 310 into the positioned groove 320. Further embodiments of the disclosed system 100 may employ other instruments to move the pressing ram 151 setting aside a mechanical actuator. Regardless of the instruments employed, it is crucial to ensure that the force generated is adjustable or at least within an acceptable range which can be partly absorbed by the damper 121 and the resilient component 122 without inflicting any damage to the fastened planar objects 300. Preferably, the force ranges from 50N to 1000N relying on the materials and thickness of the planar objects 300 to be joined. A load cell may connect to the actuator or the pressing ram 151 to gauge the actual compression or pressing force generated. The disclosed system 100 shall then report and reveal the gauged force to the user such that the user can modify the level of the generated force accordingly. The load cell, the actuator and/or the pressing ram 151 may electrically connect to a microcontroller for communication and movement synchronization. The pressing ram 151 in some embodiments can transverse around the horizontal plane and the vertical plane to pick up the fastening pin 310. In these embodiments, a bowl feeder storing a plurality of pins 310 may be positioned around the pressing ram 151. The pressing ram 151 can pick a pin 310 from the feeding bowl in before initiation of each pressing cycle. Particularly, the pressing ram 151 is moved at the horizontal axis to suspend above the feeding bowl then displaced towards the feeding bowl to pick the pin 310 using its tip 152 following by retracting upward with the picked pin 310. The actuator then moves the pressing ram 151 and the picked pin 310 to the position above the damper 121 and the groove 320 of the planar objects 300. After displacing the ram and inserting the pin 310 into the groove 320, the pressing ram 151 resumes its hanging position and repeats the flow of pin picking and insertion. The disclosed system 100 can further comprise a conveyor terminating to the feeding bowl to constantly supply pins 310. The conveyer may consistently agitate the pins 310 delivered along its track to put the pins 310 into the correct orientation prior to picking up by the pressing ram 151. Presence of the pin 310 in the bowl feeder can be monitored using any known sensor in the field. Moreover, an alignment sensor or camera is used concurrently with the pressing ram 151. The alignment sensor is dedicated for the disclosed system 100 to measure and align the pressing ram 151 and the held pin 310 in relation to the groove 320 to be fitted with the pin 310 for joining the planar objects 300. The sensor may be in communication with the microcontroller that the information gathered will be fed to the microcontroller to analyse and process for accurately align the pressing ram 151 for pin insertion.

Figure 7:
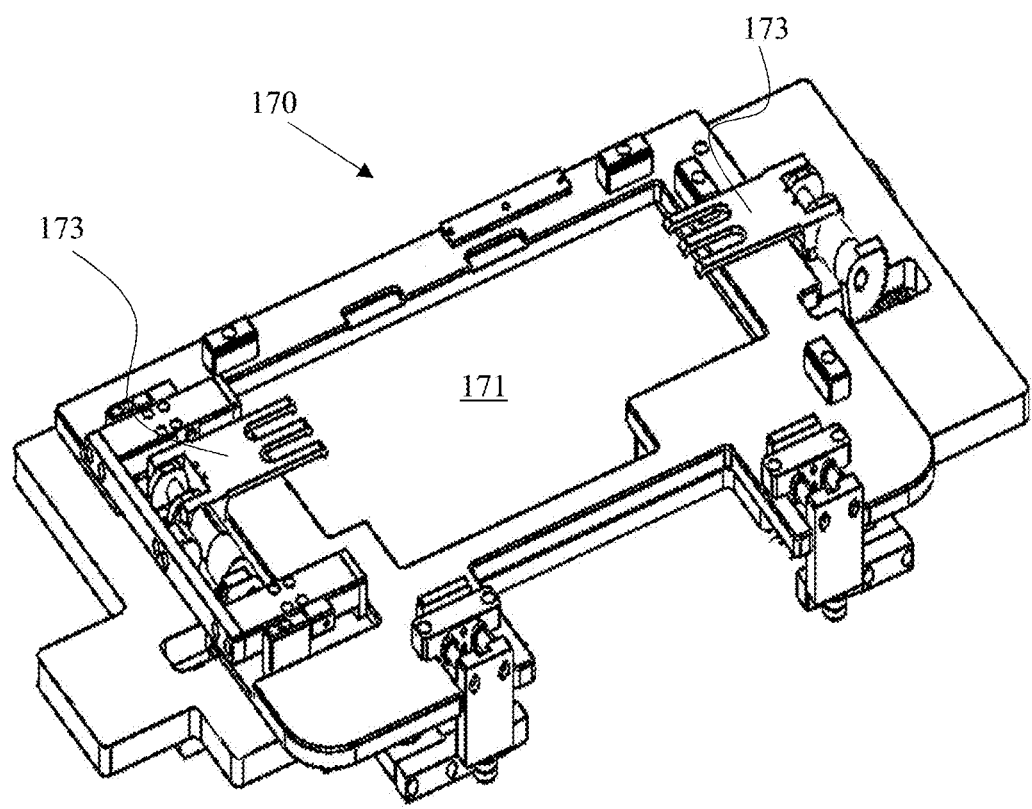
FIG. 7 represents one further embodiment shown in FIG. 5 with the placement platform established around the damping module and the compensatory mechanism.

FIG. 7 illustrates one embodiment of the placement platform 170. The placement platform 170 is a frame including a planar stage where the stacked planar objects 300 are placed or positioned to be fastened by the disclosed system 100. The stage essentially encompasses a void area 171 permitting the disclosed system 100 to bring the damper 121 to contact with the underside surface of the bottommost planar object. Each of the stacked planar objects 300 has a top planar surface and an underside planar surface. Each planar object carries a plurality of corresponding holes which become aligned accordingly to form a plurality of longitudinal grooves 320 upon placement onto the platform 170. The platform 170 is preferably configured to shift one of the grooves 320 of the stacked planar objects 300 under the pressing ram 151 such that the held tack pin 310 is insertable into the positioned groove 320 for fastening the stacked planar objects 300 thereby for each pressing cycle. In the meantime, the head portion 126 of the damper 121 is substantially aligning with the pressing ram 151 and the positioned groove 320 abutting onto the underside surface of the bottommost stacked object. The movement of the planar objects 300 on the placement platform 170 in relation to the pressing ram 151 is generally controlled by the microcontroller based upon the input from the user of the disclosed system 100 with respect to the parameters and configurations of the planar objects 300 especially about the coordinates of each pin fitting hole with respect to one or more datums or reference points found on the placement platform 170 to help the microcontroller to adjust the position of the pressing ram 151 and the placement platform 170 in conjunction with the information collected by one or more sensors. Besides reference datum, the placement platform 170 may be built with one or more alignment wedges applicable by the user or the microcontroller to ease the placed planar object 300 to a preferred position on the platform. These alignment wedges further secure the planar objects 300 to the platform free from undesired shifting likely induced by the movement of the placement platform 170 about the horizontal plane. The placement platform 170 can effectuate the movement of the planar object 300 at the x-axis and y-axis on the horizontal plane respectively via an x-axis carriage and a y-axis carriage. The carriages may be mobilized by pneumatic-, hydraulic, mechanic- or electric-based actuator in various embodiment of the disclosed system 100 as long robust linear motion can be obtained. For few embodiments, the placement platform 170 is mounted with one or more clamps 173 to constrain the movement of the planar object 300 in relative to the placement platform 170 in the period of pin insertion. These clamps 173 can be changed in between a lock and an unlock position by the user or the microcontroller to separately secure and release the placed planar objects 300.

As highlighted in the foregoing description, the disclosed system 100 features a compensatory mechanism which specifically work together with the damping module 120 to further avoid cracking of the fastened planar objects associated to the aging of the damper 121 and/or flatness of the underside surface of the bottommost object 300 supported by the damper 121. Preferably, the compensatory mechanism engages to the damping module 120 and is capable of adaptively adjusting position of the head portion 126 of the damper 121 in relation to the pressing ram 151 at the vertical and/or horizontal plane. the compensatory mechanism adjusts the distance spanned between the head portion 126 of the damper 121 and the tip 152 of the pressing ram 151 corresponding to the wearing status of the damper 121 after subjecting the damper 121 to multiple pressing cycles.

According to several embodiments, the compensatory mechanism comprises a construct 181 on which the damping module 120 is mounted, a first cam 182 fabricated with a track profile 183, and a first follower 184 engaged to the construct 181 being secured into the track profile 183 and slidable along the track profile 183 of the first cam 182 as represented in FIG. 2. Particularly, the construct 181 shown in the embodiment of FIG. 2 is substantially rectangular in shape. The damping module 120 is disposed on the top of the construct 181. A pair of anchorage blocks, a front anchorage block 191 and a back-anchorage block 192, are vertically raised respectively at the front and back of the first cam 182, the damping module 120 and the construct 181. The first cam 182 is positioned between the front 191 and the back-anchorage block 192. The planar surface of the front anchorage block 191 is relatively large in size than the back-anchorage block 192. The front anchorage block 191 bears a longitudinally running curb 195 raising towards the first cam 182 and the construct 181. A pair of parallel troughs 196 are carved lengthwise along the side of the curb 195. The front surface of the construct 181 may be presented with a pair of opposing brackets respectively hooking onto the pair of troughs 196 of the curb 195 permitting sliding movement of the construct 181 and the damping module 120 along the vertical axis without dislodging from the front anchorage block 191. The bottom of the construct 181 terminates into the first follower 184. The first cam 182 illustrated in FIG. 2 is a disc cam though other types of cam can be employed for other embodiments with or without further modifications. The disc cam or the first cam 182 is substantially circular with an outer circumference rotatable about a central axis 197, which is connected to an electrical motor capable of rotatably driving the first cam 182. The outer circumference of the first cam 182 is gradually spacing further away from the central axis 197 or the outer circumference is literally spiraling away from the central axis 197. As one can see in FIG. 2, the part on the circumference closest to the central axis 197 and the part of the circumference furthest away from the central axis 197 are mated at one end piece 199. The track profile 183 is a groove carved on the disc cam curving along the spiraling circumference that the first follower 184 slidably engages to the groove. The outer circumference of the first cam 182 defines the angle or degree of the track profile 183 spiraling away from the central axis 197 hence characterizing the distance to be travelled by the first follower along the track profile 183 to adjust the height of the damping module 120 in relation to the pressing ram 151. For instance, the construct 181 and the damping module 120 are compelled to elevate vertically along the path set out by the troughs 196 upon rotating the first cam 182 anti-clockwise and vice versa. Specifically, the height of the damper head 126 becomes lower when it is damaged under the repetitive compression force. The height of the damage damper head 126 can be restored using the compensatory mechanism by spinning or dialling the first cam 182 at a predetermined angle especially after the microcontroller or the user of the disclosed system 100 finds that there is such need to prevent the compression force from damaging the planar object 300. When a new damper 121 is installed, the first cam 182 can be rotated clockwise to lower the height of the damper head 126 or bring the damper head 126 closer to the central axis 197. Essentially, the first follower 184 engaged to the track profile 183 of the first cam 182 is slidable on the track profile 183 to move the construct 181 as well as the damping module 120 along the vertical axis thus adjusting the distance spaced between the head portion 126 of the damper 121 and the tip 152 of the pressing ram 151.

There are several approaches which the microcontroller can rely on for managing the compensatory action to mitigate on the damages of the damper 121 and the resilient component 122 caused by the repetitive compression force. For more embodiments, the microcontroller communicates with a database or library. The database may be a localized set-up directly integrated to the disclosed system 100 or being established remotely like a cloud storage or a computer server. The database stores a plurality of information including parameter records of different planar objects 300 processable by the disclosed system, reference datum to be used for each type of the processable planar objects 300, and the coordinates of different pin holes on each type of the processable planar objects 300, etc. The microcontroller accesses this information from the database to regulate the pressing cycle ascertaining that the compression force applied is within the range which the planar objects 300 and damping module 120 can tolerate. The microcontroller also manages movement of the placement platform 170 during the pin insertion process based on the information kept in the database. Furthermore, the database comprises a plurality of references data that each associate to a predetermined distance adjustment required for the head portion 126 of the damper 121 upon having the damper and resilient component subjected to a predetermined number of pressing cycles. The reference data can be collected through experiments conducted on planar objects 300 of different thickness and materials. Some of the experiments are described in the examples furnished hereinafter. According to a number of embodiments, the microcontroller of the disclosed system 100 is configured to monitor wearing status of the damper 121 by way of counting the number of pressing cycles, which the damper and/or the resilient component has been endured thus far, then drive the rotational movement of the first cam 182 according to the monitored wearing status. More specifically, the microcontroller matches the counted number of endured pressing cycles to the reference data which is associated to the type and parameters of the planar objects 300 being processed at the time. After referring to the associated reference data, the microcontroller determines whether to adjust the distance spaced between the head portion 126 of the damper 121 and the tip 152 of the pressing ram 151 or not according to the predetermined distance adjustment given in the reference data. The compensatory action to adjust the position of the damper module 120 may not be necessarily required if the counted pressing cycles endured has not reached a given threshold. Apart from solely depending on the reference data, the microcontroller may be configured to compute the distance adjustment for the damping head with respect to the tip 152 of the pressing ram 151 using an algorithm or equation in more embodiments of the system. The variables for completing the algorithm and equation in these embodiments may be retrievable from the database. These variables correspond to the parameters and properties the planar objects 300 being processed by the system.

Figure 8A:
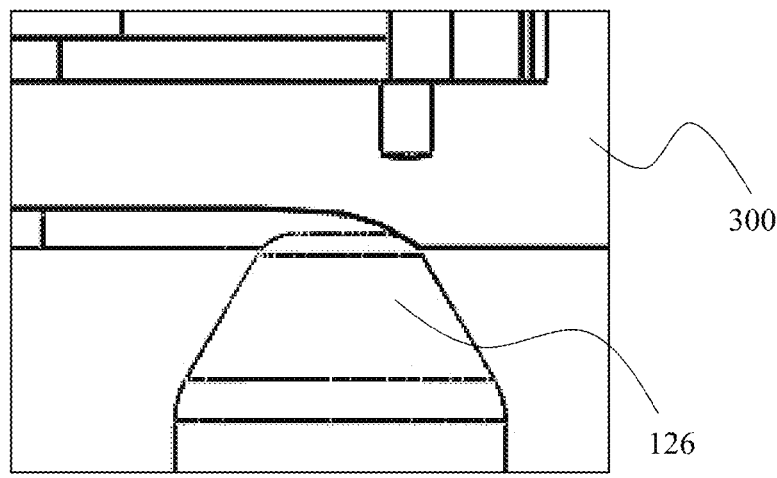
FIG. 8(a) illustrates detection of gap formed between the damper head and the underneath surface of the bottommost stacked objects
Figure 8B:
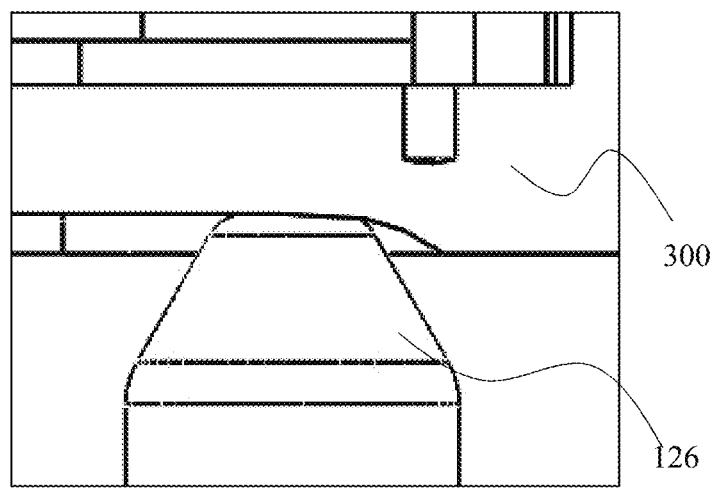
FIG. 8(b) illustrates shifting of the damper head by the compensatory mechanism upon detecting the gap to avoid potential cracking or deformation the objects during insertion of the pin.
Figure 9:
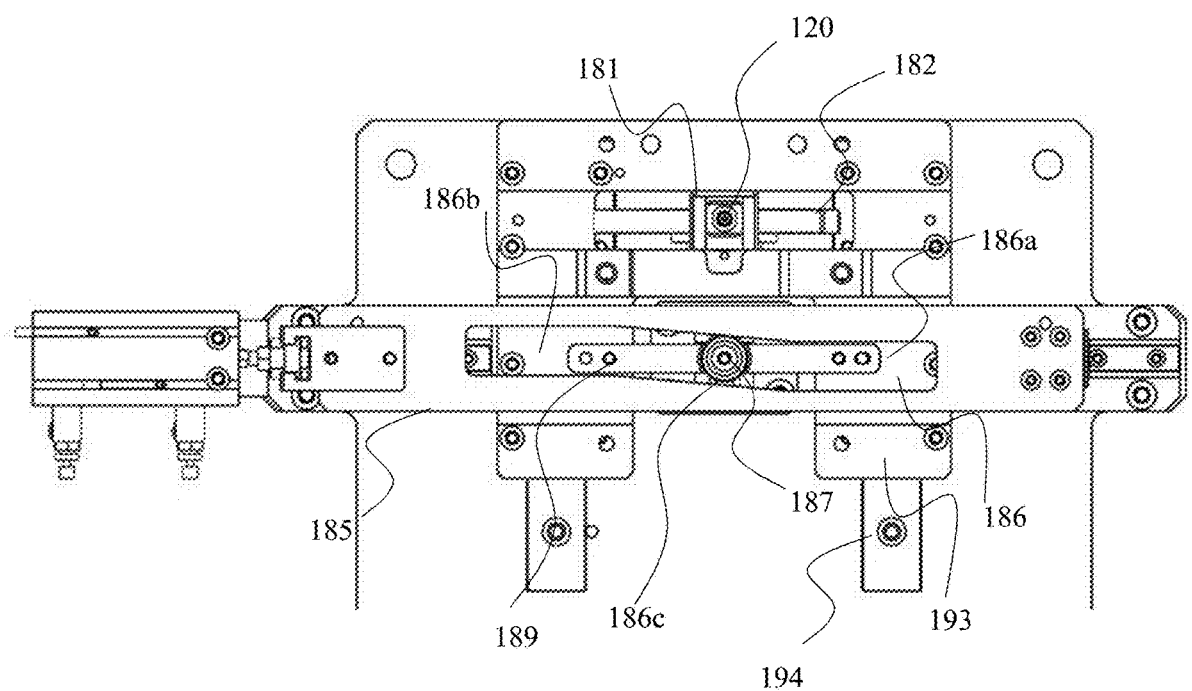
FIG. 9 shows one embodiment of the placement platform usable in the disclosed system.

Referring further to FIG. 8 and FIG. 9, more embodiments regarding the compensatory mechanism are shown. In addition to reinstate the height of a slight damaged or damaged damping module 120, the system 100 has been designed as well to prevent damage being inflicted by the pressing ram onto the working planar object due to inadequate contact between the damper head 126 and the underside surface of the bottommost planar object. Like illustrated in FIG. 8a, the bottommost planar object which the system 100 working on may have an uneven or irregular part on the underside surface to be supported by the damper head 126. Under such circumstances, the damper head 126 fails to conform on the underside surface completely. More crucially, the damper head 126 partially supporting the underside surface may not be able to fully absorb the compression force as intended but rather resulting in damaging the processed planar objects 300. In view of that, the inventors of the present disclosure resolve the aforesaid problem by further imparting the compensatory mechanism with the capability to shift the position of the damping module 120 including the damper head 126 at the horizontal plane as depicted in FIG. 8b. In some embodiments, the disclosed system 100 has a camera or sensor directed to the point where the damper head 126 contacts the bottommost planar object. The image captured by the camera or the information gathered by the sensor with regard to the point of contact is analysed via the microcontroller to detect irregularity on the point of contact. The microcontroller triggers the compensatory mechanism of the system 100 to displace the damper around the horizontal plane when detecting or expecting the damper head 126 is to abut onto an irregular part of the underside surface of the bottommost planar object 300. Shifting the damping module 120 about the horizontal plane entirely or almost entirely avoid formation of any gap in between contacting damper head 126 and the underside surface of the bottommost planar object 300.

Figure 6:
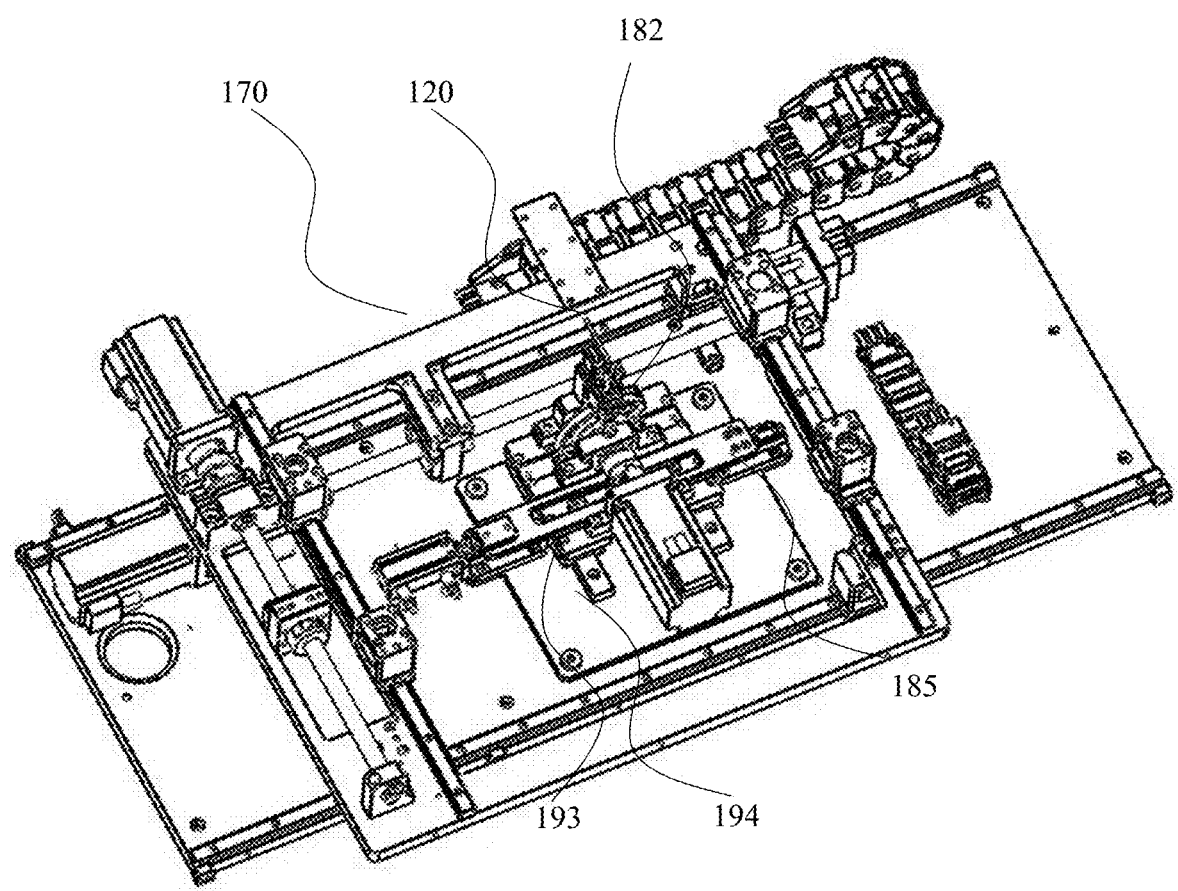
FIG. 6 shows incorporation of the first cam and second cam to the damping module in one embodiment of the disclosed system for realizing the compensatory mechanism.

Embodiments of the system 100 disclosed in FIG. 6 reveal one possible way enabling the compensatory mechanism to shift the damping module 120 forward and backward around the horizontal plane. More specifically, the damping module 120, the construct 181 which the damping module 120 mounted on, the first cam 182 and the anchorage blocks 191/192 are built on a moveable stage 193. The moveable stage 193 further engages to a pair of rails 194 at its underside surface and is slidable forward or backward on the rails 194. The compensatory mechanism further comprises a second cam 185 fabricated with a groove profile 186 in which a second follower 189 is located and connecting to the moveable stage 193 as illustrated in FIG. 3. At least one segment of the groove profile 186c is preferably slanted or tilted at an angle in relation to the second follower 189. The second cam 185 is slidable lengthwise. The second cam 185 has been arranged to slide against the second follower 189 at least around the edges of slanted segment 186 hence displacing the second follower 189 and the moveable stage 193, at the horizontal plane, connected to the second follower 189 substantially corresponding to a sliding movement of the second cam 185. In some embodiments, the second cam 185 is a plate cam with an elongate hollow groove running lengthwise. The groove has a pair of offsetting right segment 186a and left segment 186b connecting via the slanted segment 186c. The second follower 189 includes a knob 187 rotatably mounted on a bar fixed to the moveable stage 193. The knob 187 has a diameter similar or almost similar to the thickness of the slanted segment 186c. The knob 187 is positioned inside the slanted segment 186c. Sliding movement of the second cam 185 compels the edges of the slant segment 186c to push against the knob 187 leading to horizontal movement of the stage 193 and the damping module 120 including the damper head 126. For instance, moving the second cam 185 towards the left in the embodiment shown in FIG. 3 shall shift the damping module 120 and the damper head 126 backward, while moving the second ram 185 to the right pushes the damping module 120 and damper head 126 forward. The sliding movement of the second cam 185 can be driven by a linear actuator such as pneumatic cylinder, hydraulic pump or linear motor. Through the mechanical arrangement of the moveable stage 193 and the second cam 185, the compensatory mechanism of the present disclosure can further minimize the risk of damaging the planar object 300 in the fastening process by way of avoiding the formation of gap in between the contacting damper head 126 and the underside surface of the bottoms planar object 300.

Figure 11:
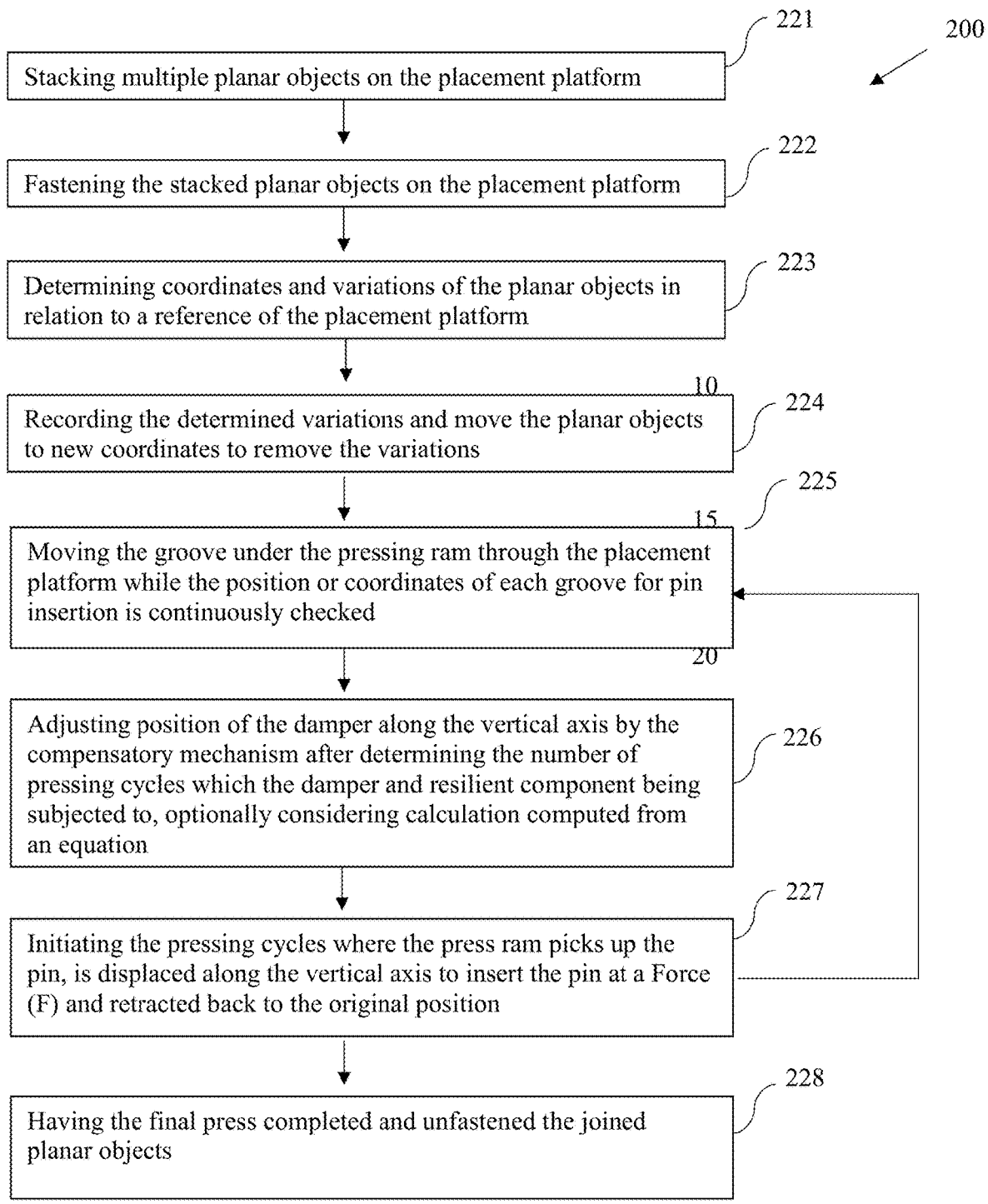
FIG. 11 is a flow-chart illustrating one embodiment of the disclosed method in compensating the degradation of the damper and the resilient component after a predetermined pressing cycle.

Another aspect of the present disclosure is directed to a method 200 of managing wearing of a damping module 120 in a system 100 for joining multiple stacked planar objects 300. The system referred in the disclosed method 200 may be similar to, but not necessarily, the system 100 mentioned in the foregoing description. For instance, the arrangement of the cams and other relating mechanical components can be modified without departing from the scope of the method 200 disclosed hereinafter. The method 200 as disclosed shall cover systems or machines which aim to provide a compensatory mechanism for recompensing wearing of a damping module supporting planar objects 300 in a pin inserting process. The disclosed method 200 may generally comprise providing the system 100 with a damping module 120, providing the system 100 with a pressing module 150, counting the number of pressing cycles carried out by the pressing module 150 to determine a wearing status of the damping module 120, matching the counted number of pressing cycles to a plurality of reference data stored in a database; and adjusting the distance spaced between the damping module 120 and the pressing module 150 according to a predetermined distance adjustment to compensate wearing of the damping module 120. It is important to note that the disclosed method 200 can be partly or entirely integrated to one or more process designed for fastening or joining multiple planar objects 300 as shown in the flowchart of FIG. 11. In more specific, the damping module 120 of the disclosed method 200 comprises a damper 121 and a resilient component 122 arranged within a holder 124 with the resilient component 122 located immediately under the damper 121. The damper 121 includes a head portion 126 protruding out from an opening 128, preferably a top opening, of the holder 124 to abut onto the underside surface of the bottommost stacked object 300. Preferably, the damping module 120 is displaceable along the vertical axis. Furthermore, the pressing module 150 comprises a pressing ram 151 spaced apart from the damping module 120 at a distance and being vertically displaceable to insert a held tack pin 310 into a groove 320 of the multiple stacked planar objects 300 aligned thereby. The pressing ram 151 travels along the distance around the vertical axis exerting a compression force for fastening the stacked planar objects 300 in each pressing cycle. The movement of the pressing ram 151 can be powered by an actuator capable of generating the sufficient compression force for punching the pin into the groove. The displaced pressing ram 151 subjects the damper 121 and the resilient component 122 to the compression force exerted in each pressing cycle that the compression force wears the damper 121 and/or the resilient component. The pressing module 150 including the pressing ram 151 can be in consistent communication with a microcontroller tasked to manage the movement and the force of the pressing ram 151. As summarized in FIG. 11, before proceeding to joining the planar objects 300, few embodiments of the disclosed method 200 may need the multiple planar objects 300 stacked 221 and fastened 222 to a placement platform 170 of the system 100. Preferably, the placement platform 170 is moveable at the horizontal plane for the system 100 to insert a pin 310 for each aligned groove to fasten the stacked planar object together. The movement of the placement platform 170 in the disclosed system 100 may be managed by the microcontroller in some embodiments. In order to move the placement platform 170 accurately, the disclosed method 200 prompts the microcontroller to determine coordinates 223 of a plurality of pin holes on the planar objects 300 and the coordinates of the planar objects in relation to one or more reference or datum point found on the placement platform 170. Meanwhile, the disclosed method 200 also requests the microcontroller to determine any variations of the coordinates with reference to one or more datums on the placement platform 170. Subsequently, the microcontroller records all the variations detected and compute new coordinates for the pin holes as well as planar objects 300 that the new coordinates will remove the determined variations for positioning the planar objects 300 better. Using the computed new coordination, the microcontroller moves 224 the placement platform 170 along with the planar objects 300 to the new position to remove or clear the variations with respect to the positioning of the planar objects 300 on the placement platform 170. Like in the setting forth, the corresponding pin holes of the stacked planar objects 300 become aligned to form the pin receiving grooves 320 once being laid on the placement platform 170. The disclosed method 200 further prompts the microcontroller to guide the first groove under the pressing ram 151 for pin insertion while the position of the first groove is checked or referred to the information kept in a database as shown in step 225 of FIG. 11.

After aligning the first groove under the pressing ram 151, the disclosed method 200 measures or determines the wearing status of the damper 121 and/or the resilient component 122 based on the number of pressing cycles these components endured thus far. The counting of the pressing cycles may be conducted by the microcontroller, which is concurrently communicating with the pressing module 150, the database and a compensatory mechanism capable of adjusting the distance of the damper 121 in relation to the tip 152 of the pressing ram 151. Alternatively, a counter is electrically coupled to the pressing ram 151 to compute the pressing cycles carried out and feeds the info collected to the microcontroller for managing the compensatory mechanism. The disclosed method 200 further matches the latest counted number of pressing cycles to a plurality of reference data stored in the database that each reference data associates to a predetermined distance adjustment required for the head portion 126 of the damper 121 upon reaching or enduring a predetermined number of pressing cycles. Preferably, the matching is performed using the microcontroller communicating with the database.

After referring to the associated reference data, the disclosed method 200 adjusts the distance spaced between the head portion 126 of the damper 121 and the tip 152 of the pressing ram 151 according to the predetermined distance adjustment given in the reference data, preferably through the microcontroller as indicated in step 226 of FIG. 11. Note that the disclosed method 200 may not proceed to the distance or position adjustment of the damper 121 in case the latest counted pressing cycles has not yet reached the predetermined threshold requiring the position change for the damper 121. Otherwise, the step 226 of adjusting the distance spaced between the head portion 126 of the damper 121 and the pressing ram 151 at the vertical axis is effectuated according to the predetermined distance adjustment targeted to compensate wearing of the damper 121 and/or the resilient component 122 by way of displacing the damping module 120 along the vertical axis. The disclosed method 200 may need the microcontroller to compute the distance adjustment for the damping head with respect to the tip 152 of the pressing ram 151 using an algorithm or equation in other possible embodiments of the present disclosure. Once the requirement of position adjustment has been fulfilled, the disclosed method 200 prompts the microcontroller to initiate the pressing cycles where the pressing ram 151 picks up the then being displaced along the vertical axis to insert the pin 310 at a Force (F) and retracted back to original position as indicated in step 227. Several embodiments of the disclosed method 200 preferably repeat step 225, 226 and 227 for pin insertion of each subsequent groove 320 until completing the final press for the final groove.

along the track profile 183 to adjust the height of the damping module 120 in relation to the pressing ram 151. Through adjusting the level of the damping module 120 along the vertical axis in relation to the pressing module 150, the disclosed method 200 recompenses the height of the damaged damper head 126 by way of spinning or dialling the first cam 182 at a predetermined angle.

In accordance with further embodiments, the damper 121 and the resilient component 122 of the disclosed method 200 are made of elastic material of respectively different material characteristics. More importantly, the reference data in the database are sorted according to combined Young's Modulus value of the damper 121 and resilient component 122.

Example 1

Figure 10A:
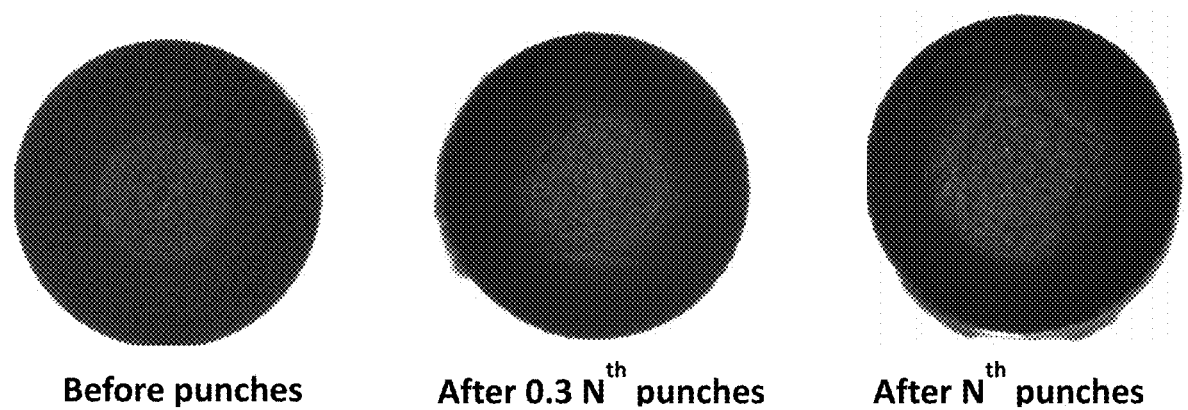
FIG. 10(a) shows images of the wearing status of the tested damper head respectively before punches, at 0.3 $N^{th}$ punches and at $N^{th}$ punches.
Figure 10B:
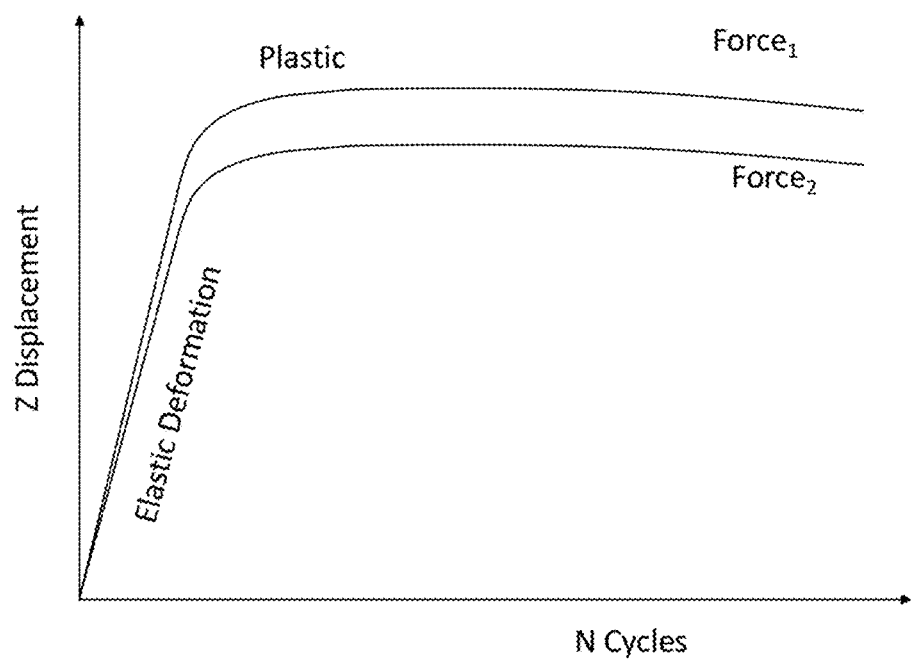
FIG. 10(b) is a graph showing relationship between displacement or deformation of the damper head at its height (or displacement at Z-axis) and the number of pin insertion cycles under various compression forces.

Experiment was conducted on a single damper by compressing it using Force (F) for a total of N cycles. The deformation in terms of height differences was measured at every 1000 cycles. The results obtained showed that the damper suffered significant deformation in depth or length during the first 1000 cycles and remained substantially unchanged after $0.25N^{th}$ cycles. Nonetheless, the damper appeared to have more cracks on it after $0.3N^{th}$ cycles. Images of the dampers captured before initiation of the compression cycles, $0.3N^{th}$ cycles and $N^{th}$ cycles are showed in FIG. 10a. Details of the results can be found in Table 1 below.

TABLE 1

| Damper Height Difference for 1000 punch internals with Force (F) up to N punches | | | | |
|---|---|---|---|---|
| Force (Newtons) | Number of Punches (N) | Damper Height (mm) before 1000 punches | Damper Height (mm) after 1000 punches | Damper Height Difference (mm) |
| F | 1000 | $Z_0$ | $Z_{1000}$ | $\Delta Z_{1000}$ |
| F | 2000 | $Z_{1000}$ | $Z_{2000}$ | $\Delta Z_{2000}$ |
| F | 3000 | $Z_{2000}$ | $Z_{3000}$ | $\Delta Z_{3000}$ |
| F | ... | ... | ... | ... |
| F | N | $Z_{N-1000}$ | $Z_N$ | $\Delta Z_N$ |

Still, in a number of embodiments, the adjusting step is carried out by the compensatory mechanism comprising a construct 181 on which the damping module 120 is mounted, a first cam 182 fabricated with a track profile 183 and a first follower 184 engaged to the construct 181 being secured into the track profile 183. The bottom of the construct 181 terminates into the first follower 184. The first follower 184 is slidable along the track profile 183 of the first cam 182, corresponding to a rotational movement of the first cam 182 at an axis parallel to the planar surfaces. More specifically, the first cam 182 is a disc cam shaped substantially in circle with an outer circumference rotatable about a central axis 197, which is preferably connected to an electrical motor capable of rotatably moving the first cam 182. The outer circumference of the first cam 182 is gradually spacing further away from the central axis 197 or the outer circumference is literally spiraling away from the central axis 197. The track profile 183 is a groove fabricated on the disc cam running along the spiraling circumference that the first follower 184 slidably engages to the groove. The part on the circumference closest to the central axis 197 and the part of the circumference furthest away from the central axis are mated at one end piece 199. The outer circumference of the first cam 182 defines the angle or degree of the track profile 183 spiraling away from the central axis 197 hence characterizing the distance to be travelled by the first follower Aspects of particular embodiments of the present disclosure address at least one aspect, problem, limitation, and/or disadvantage associated with existing machine or system for fastening multiple stacked planar sheets using tack pin or the like. While features, aspects, and/or advantages associated with certain embodiments have been described in the disclosure, other embodiments may also exhibit such features, aspects, and/or advantages, and not all embodiments need necessarily exhibit such features, aspects, and/or advantages to fall within the scope of the disclosure. It will be appreciated by a person of ordinary skill in the art that several of the above-disclosed structures, components, or alternatives thereof, can be desirably combined into alternative structures, components, and/or applications. In addition, various modifications, alterations, and/or improvements may be made to various embodiments that are disclosed by a person of ordinary skill in the art within the scope of the present disclosure, which is limited only by the following claims.

The invention claimed is:

1. A system for joining multiple stacked planar objects, each of the stacked planar objects having a top planar surface and an underside planar surface while carrying a plurality of corresponding holes which become aligned accordingly to form a plurality of longitudinal grooves upon placement onto a placement platform, the system comprising:

a damping module including a damper and a resilient component arranged within a holder with the resilient component located adjacent to the damper, the damper including a head portion protruding out from an opening of the holder;

a pressing module incorporated with a pressing ram is mounting apart on top of the head portion of the damper with a distance spanned between the pressing ram and the damper, the pressing ram having a tip to hold a tack pin and being displaceable at a vertical axis towards the head portion of the resilient component;

the placement platform for placement of the multiple stacked planar objects, the placement platform being configured to position one of the longitudinal grooves of the stacked planar objects under the pressing ram such that the hold tack pin is insertable into the positioned longitudinal groove for fastening the stacked planar objects thereby for each pressing cycle, the head portion of the damper substantially aligning with the positioned longitudinal groove and abutting onto the underside planar surface of the planar stacked objects, the damper and the resilient component being subjected to a compression force for each pressing cycle upon insertion of the tack pin into the positioned longitudinal groove by the pressing ram; and a compensatory mechanism engaging to the damping module, the compensatory mechanism is being adaptively adjusting position of the head portion of the damper in relation to the pressing ram at a vertical and/or a horizontal plane.

2. The system of claim 1, wherein the compensatory mechanism adjusts a distance spanned between the head portion of the damper and the tip of the pressing ram corresponding to a wearing status of the damper after subjecting the damper to multiple pressing cycles.

3. The system of claim 2, wherein the compensatory mechanism comprises a construct on which the damping module is mounted, a first cam fabricated with a track profile, and a first follower engaged to the construct being secured into the track profile and slidable along the track profile of the first cam corresponding to a rotational movement of the first cam at an axis parallel to the planar surfaces that the first follower sliding on the track profile moves the construct as well as the damping module along the vertical axis thus adjusting the distance spaced between the head portion of the damper and the tip of the pressing ram.

4. The system of claim 3 further comprising a microcontroller being configured to monitor wearing status of the damper by way of counting the number of pressing cycles and drive the rotational movement of the first cam according to the monitored wearing status.

5. The system of claim 4, wherein the microcontroller matches the counted number of pressing cycles to a plurality of references data stored in a database that each reference data associates to a predetermined distance adjustment required for the head portion of the damper upon reaching a predetermined number of pressing cycle, and the microcontroller adjusts the distance spaced between the head portion of the damper and the tip of the pressing ram according to the predetermined distance adjustment.

6. The system of claim 1, wherein the compensatory mechanism displaces the damper at the horizontal plane when the top of the head portion lands onto an irregular part of the underside surface of the planar stacked objects to avoid formation of any gap in between the top of the head portion and the underside surface.

7. The system of claim 6, wherein the compensatory mechanism comprises a construct on which the damping module is mounted on, the construct being based on a moveable stage, a second cam fabricated with a groove profile in which the second follower is located and connecting to the moveable stage, the second cam being slidable lengthwise that the edges of the groove profile displace the second follower and the moveable stage connected to the second follower at the horizontal plane corresponding to a sliding movement of the second cam.

8. The system of claim 7, wherein the movement of the second cam is driven by a linear actuator.

9. The system of claim 1, wherein the damper is defined by a base retained within the holder, said damper includes a body extending away from the base and gradually converging or tapering into the head portion with the head portion carrying the substantially flat top.

10. The system of claim 1, wherein the resilient component is a column structure with a substantially flat top and flat bottom respectively contacting to the damper and the support that a through bore is extending from the top towards bottom of the column-like member, the resilient component is being configured to absorb portion of the compression force with the through bore providing sufficient room for the resilient component to temporarily deform.

11. The system of claim 10, wherein the damper and the resilient component are made of elastic material of respectively different material characteristics.

* * * * *